(12) United States Patent
Kline et al.

(10) Patent No.: US 7,967,638 B1
(45) Date of Patent: Jun. 28, 2011

(54) MEZZANINE CONNECTOR WITH CONTACT WAFERS HAVING OPPOSITE MOUNTING TAILS

(75) Inventors: Richard Scott Kline, Mechanicsburg, PA (US); Howard Wallace Andrews, Hummelstown, PA (US); Robert William Brown, Harrisburg, PA (US)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/732,206

(22) Filed: Mar. 26, 2010

(51) Int. Cl.
*H01R 13/648* (2006.01)
(52) U.S. Cl. ................... 439/607.07; 439/74
(58) Field of Classification Search ........... 439/607.07, 439/74, 607.06, 701
See application file for complete search history.

(56) References Cited

U.S. PATENT DOCUMENTS

| | | | |
|---|---|---|---|
| 5,429,520 A | 7/1995 | Morlion et al. | |
| 6,267,604 B1 * | 7/2001 | Mickievicz et al. | 439/79 |
| 6,299,483 B1 * | 10/2001 | Cohen et al. | 439/607.07 |
| 6,409,543 B1 * | 6/2002 | Astbury et al. | 439/607.07 |
| 6,743,050 B1 * | 6/2004 | Wu | 439/607.06 |
| 6,773,305 B2 * | 8/2004 | Wu | 439/607.07 |
| 7,104,808 B2 * | 9/2006 | Korsunsky et al. | 439/76.1 |
| 7,108,567 B1 * | 9/2006 | Korsunsky et al. | 439/701 |
| 2003/0119362 A1 * | 6/2003 | Nelson et al. | 439/608 |
| 2009/0011642 A1 | 1/2009 | Amleshi et al. | |

* cited by examiner

*Primary Examiner* — Gary F. Paumen
(74) *Attorney, Agent, or Firm* — Ming Chieh Chang; Wei Te Chung; Andrew C. Cheng

(57) ABSTRACT

A mezzanine connector for connecting first and second circuit boards includes a number of wafers side-by-side arranged with each other and an organizer for unifying the wafers. Each wafer includes an insulative housing, a number of contacts fixed in the insulative housing and a shielding plate assembled to a first side of the insulative housing in order to shield the contacts of the adjacent wafers. Each contact includes a retaining portion fixed in the insulative housing, a first tail extending from a first end of the retaining portion for being mounted to the first circuit board, and a second tail extending from a second end of the retaining portion for being mounted to the second circuit board.

20 Claims, 9 Drawing Sheets

MEZZANINE CONNECTOR WITH CONTACT WAFERS HAVING OPPOSITE MOUNTING TAILS

BACKGROUND OF THE INVENTION

1. Field of the Invention

The present invention relates to a mezzanine connector with opposite mounting tails, and more particularly to a mezzanine connector with contact wafers having opposite mounting tails connected to parallel circuit boards for reliable interconnection.

2. Description of Related Art

In high speed signal transmission between circuit boards, connector assemblies for being respectively mounted to such circuit boards are usually provided. U.S. Pat. No. 5,429,520 issued on Jul. 4, 1995 discloses such a connector assembly including a header connector mounted to a backplane board and a daughter card connector mounted to a daughter board, in order to establish signal transmission between the backplane board and the daughter board. The header connector includes a receiving space and a plurality of header contacts with contacting sections extending into the receiving space. The daughter card connector is adapted for being inserted into the receiving space of the header connector and includes a plurality of receptacle contacts for mating with the contacting sections of the header contacts. The header connector and the daughter card connector are detachable with each other. However, in this arrangement, on one hand, a pair of connectors are needed, and on the other hand, some lock and grounding structures are required to ensure connection qualities between the connectors, which will increase design and manufacturing costs.

Hence, a mezzanine connector with improved mounting tails is needed to solve the above problem.

BRIEF SUMMARY OF THE INVENTION

The present invention provides a mezzanine connector for connecting parallel first and second circuit boards including a plurality of wafers side-by-side arranged with each other and an organizer for unifying the wafers. Each wafer includes an insulative housing, a plurality of contacts fixed in the insulative housing and a shielding plate assembled to a first side of the insulative housing in order to shield the contacts of an adjacent wafer. Each contact includes a retaining portion fixed in the insulative housing, a first tail extending from a first end of the retaining portion for being mounted to the first circuit board, and a second tail extending from a second end of the retaining portion for being mounted to the second circuit board. Each insulative housing includes a first tab extending beyond a lateral side thereof to be organized by the organizer.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
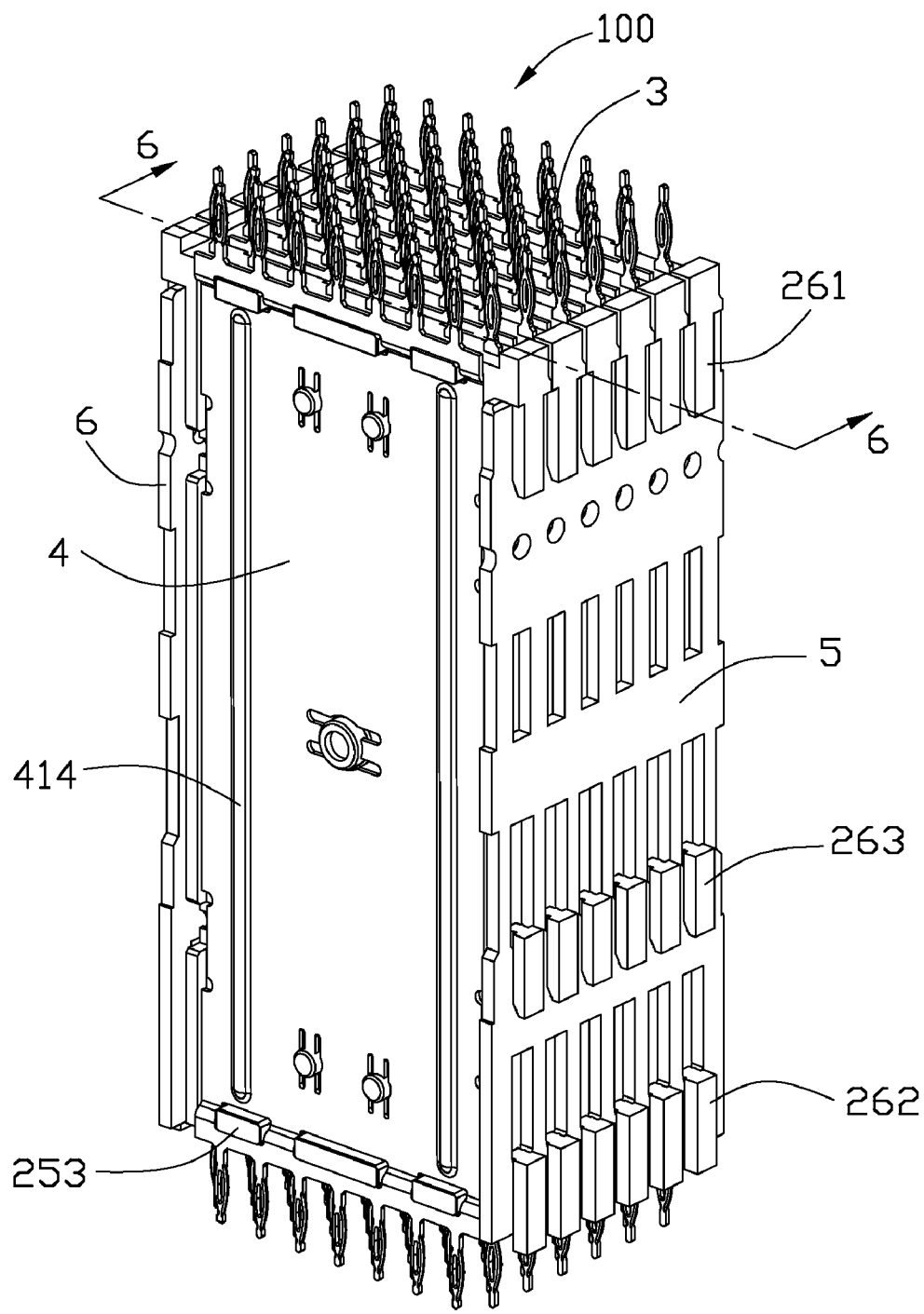
FIG. 1 is a perspective view of a mezzanine connector in accordance with an embodiment of the present invention.

Reference will now be made to the drawing figures to describe the preferred embodiment of the present invention in detail. FIGS. 1 to 4 illustrate a mezzanine connector 100 including a plurality of wafers 1 side-by-side stacked with each other and a pair of organizers 5, 6 for unifying the wafers 1. According to the embodiment of the present invention, the mezzanine connector 100 is vertical type and is adapted for directly connecting parallel first and second circuit boards 7, 8, as shown in FIG. 5.

Figure 3:
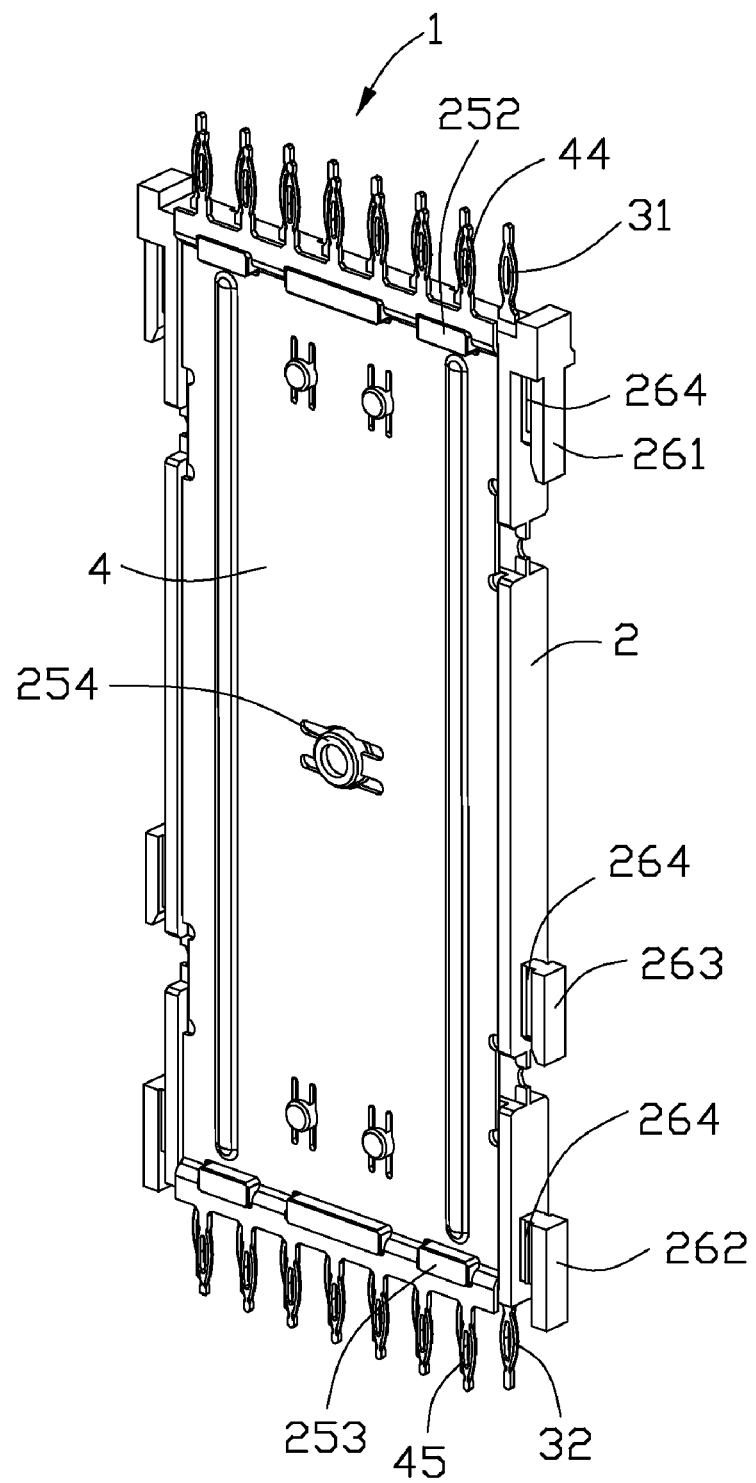
FIG. 3 is a perspective view of the wafer as shown in FIG. 2.
Figure 4:
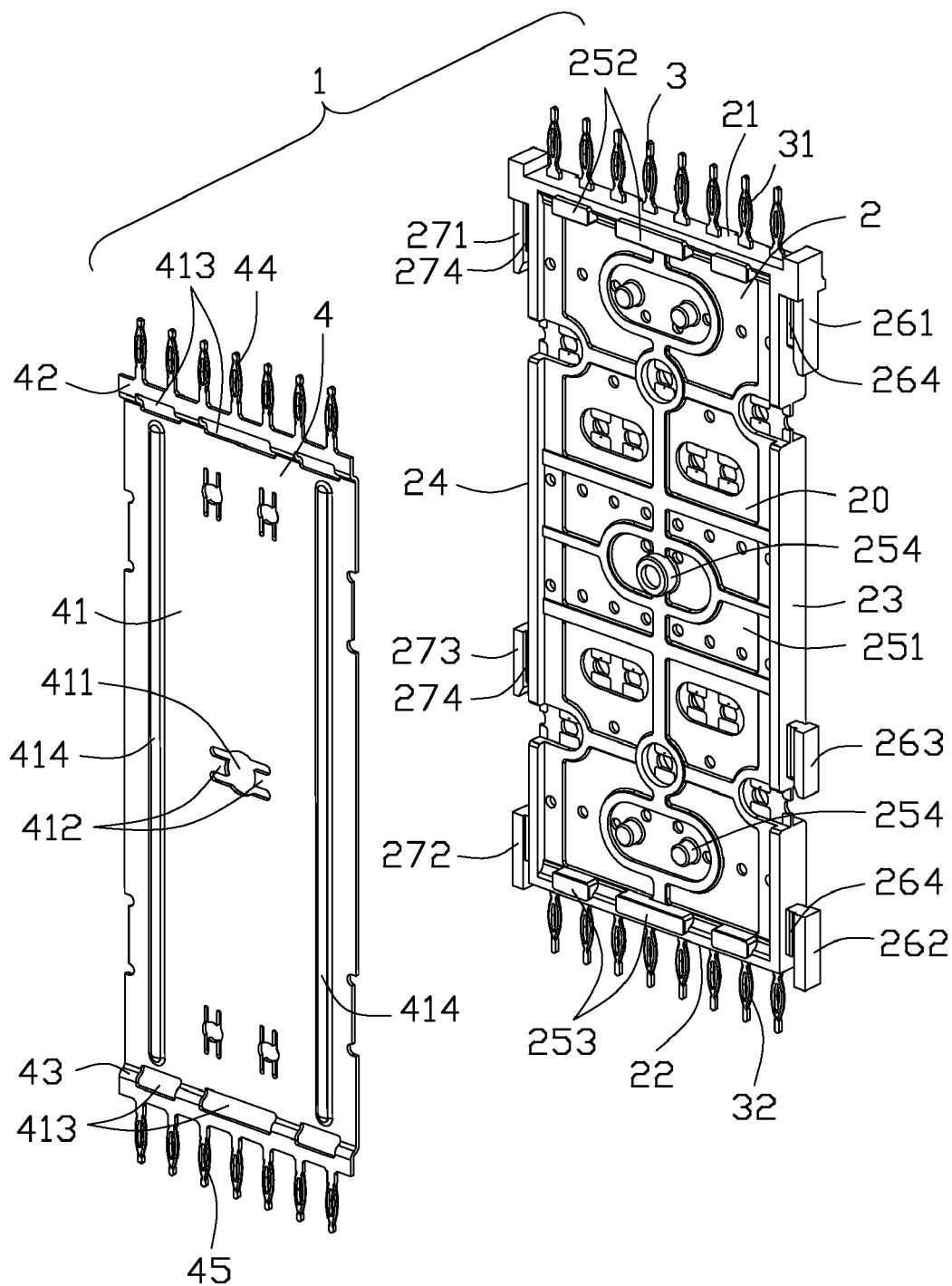
FIG. 4 is a part exploded view of the wafer with a shielding plate disassembled to an insulative housing of the wafer.
Figure 5:
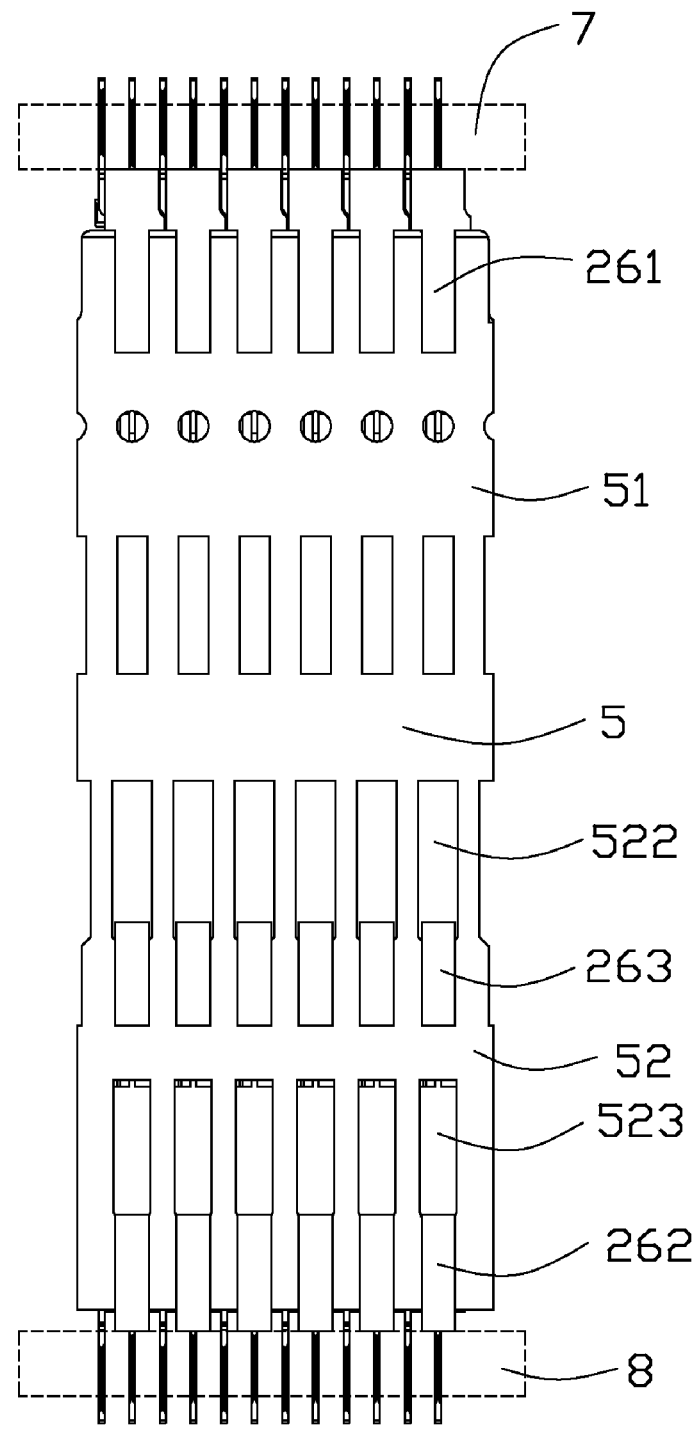
FIG. 5 is a front view of the mezzanine connector as shown in FIG. 1.

Please refer to FIGS. 3 and 4, each wafer 1 includes a rectangular insulative housing 2, a plurality of contacts 3 embedded in the insulative housing 2 and a metal shielding plate 4 mounted to a first side 20 of the insulative housing 2 to shield the contacts 3 of an adjacent wafer 1. The insulative housing 2 includes a top mounting face 21, a bottom mounting face 22, and a pair of first and second side faces 23, 24 perpendicular to the top and the bottom mounting faces 21, 22. A depression 251 is recessed from the first side 20 for receiving the shielding plate 4. The insulative housing 2 includes a plurality of first and second blocks 252, 253 adjacent to the top and the bottom mounting faces 21, 22, respectively, for positioning the shielding plate 4. The insulative housing 2 includes a plurality of positioning posts 254 in the depression 251 to fix the shielding plate 4. The insulative housing 2 further includes a first tab 261, a second tab 262 and a middle tab 263 between the first and the second tabs 261, 262. The first, the second and the middle tabs 261, 262, 263 laterally extend beyond the first side face 23 and are aligned along a vertical direction. The first and the second tabs 261, 262 are located adjacent to the top and the bottom mounting faces 21, 22, respectively. Each tab 261, 262, 263 includes an inner narrowed or contractive portion 264 for engaging with the organizer 5. Similarly, The insulative housing 2 further includes a third tab 271, a fourth tab 272 and a middle tab 273 between the third and the fourth tabs 271, 272. The third, the fourth and the middle tabs 271, 272, 273 laterally extend beyond the second side face 24 and are aligned along the vertical direction. The first and the third tabs 261, 271 are symmetric with respect to a schematic vertical line. The second and the fourth tabs 262, 272 are also symmetric with respect to such schematic vertical line. Each tab 271, 272, 273 includes an inner contractive portion 274 for engaging with the organizer 6.

Figure 8:
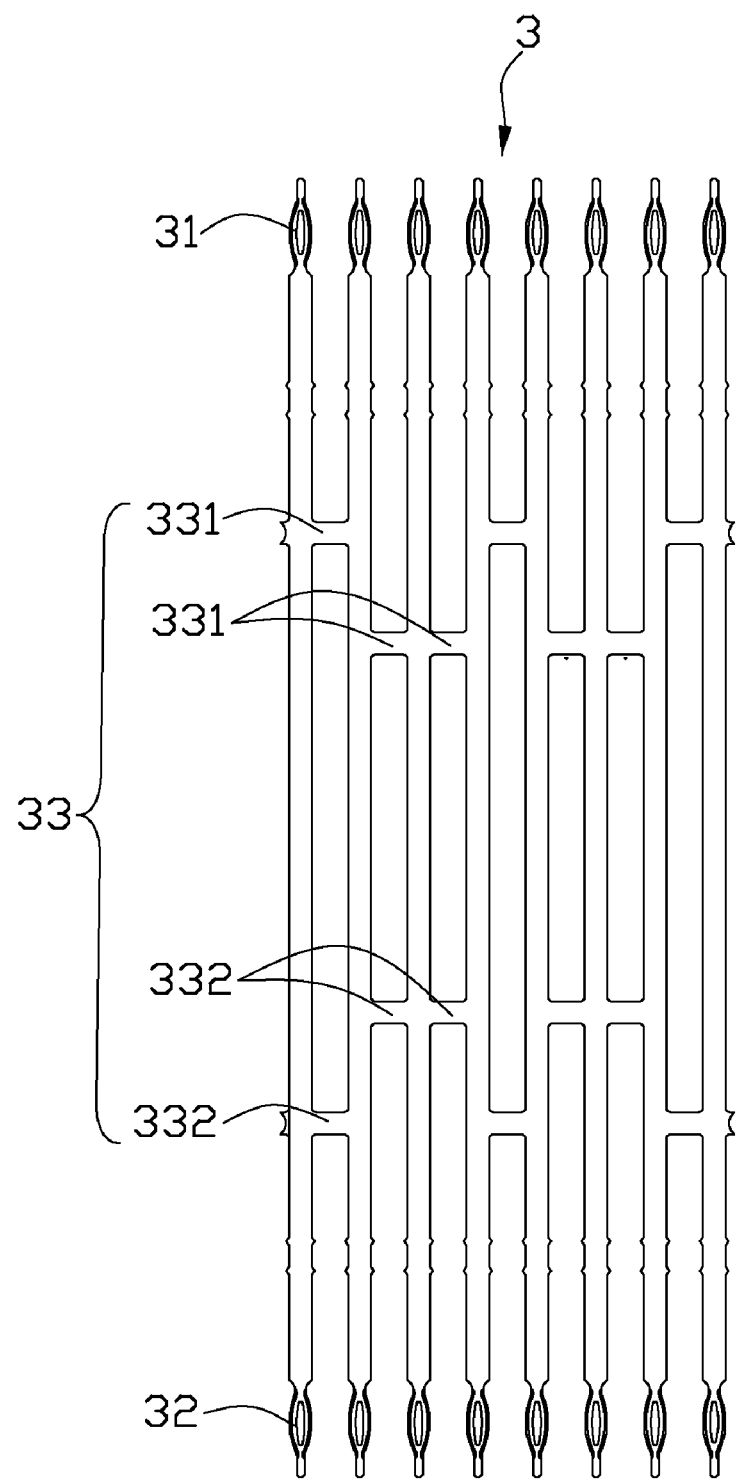
FIG. 8 is a side view of the contacts in each wafer before the insulative housing is insert molded therewith, showing that all the contacts are originally transversely linked with one another via connection sections.
Figure 9:
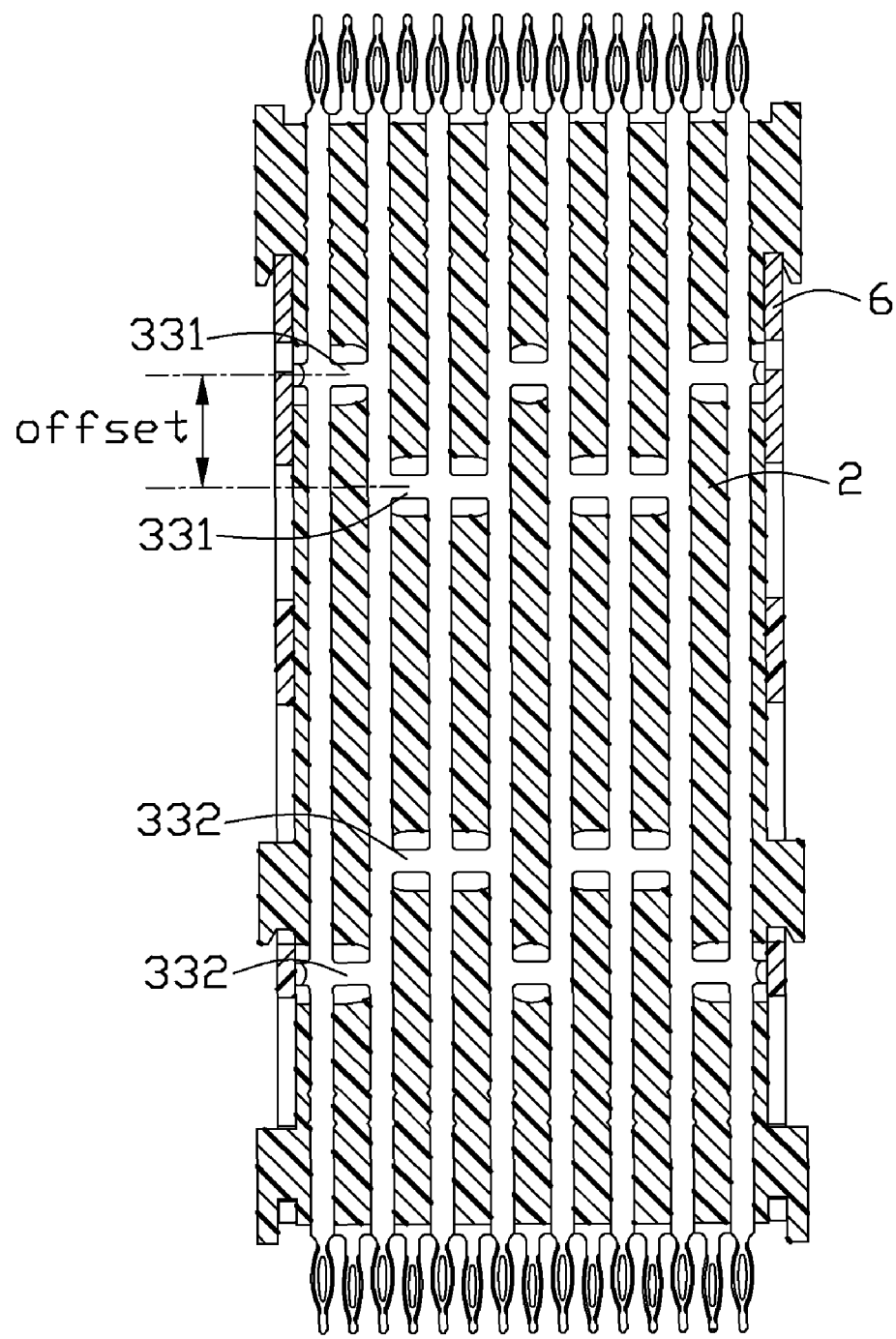
FIG. 9 is a cross-sectional view of the mezzanine connector similar to FIG. 6, before removal of the connection sections.

As shown in FIG. 4, each contact 3 includes a retaining portion (not shown) insert-molded in the insulative housing 2, a first tail 31 upwardly extending from a top end of the retaining portion, and a second tail 32 downwardly extending from a bottom end of the retaining portion. The first and the second tails 31, 32 are aligned with each other along the vertical direction. According to the embodiment of the present invention, the first and the second tails 31, 32 are press-fit complaint pins and extend beyond the first and the second mounting surfaces 21, 22 for engaging with through holes defined in the first and the second circuit boards 7, 8, respectively. According to the present invention, only one single mezzanine connector 100 instead of a connector assembly is needed to establish an electrical interconnection between the first and the second circuit boards 7, 8 for signal transmission. Referring to FIG. 8, the contacts 3 of each wafer 1 are originally transversely linked with one another via connection sections 33 each located between adjacent two contacts 3, in order to simplify insert molding of the insulative housing 2 with the contacts 3. Referring to FIG. 9, after the insulative housing 2 is insert molded with the contacts 3, the connection sections 33 are subsequently removed so that the contacts 3 are separated from one another for independent signal transmission. Every adjacent two contacts 3 have two connection sections 33 linked therebetween and spaced from each other in the vertical direction categorized as an upper connection sections 331 and lower connection sections 332. The upper connection sections 331 are not all transversely aligned with one another but in an alternate offset manner for avoiding force concentration along one transverse line due to removal of the connection sections 33 after the insulative housing 2 is insert molded with the contacts 3.

As shown in FIGS. 3 and 4, each shielding plate 4 includes a rectangular main body 41 received in the depression 251, a pair of top and bottom sections 42, 43 outwardly bent from the main body 41, and a plurality of top and bottom press-fit tails 44, 45 extending from the top and the bottom sections 42, 43 for being mounted to the first and the second circuit boards 7, 8. The main body 41 includes a plurality of through holes 411 for receiving the positioning posts 254, and a pair of arms 412 extending into each through hole 411 for engaging with the corresponding positioning posts 254. Each of the top and the bottom sections 42, 43 defines a plurality of rectangular windows 413 arranged along a transverse direction perpendicular to the vertical direction. The windows 413 are adapted for receiving the corresponding first and second blocks 252, 253 in order to reinforce the shielding plates 4 when they are mounted to the first and the second circuit boards 7, 8. Besides, the main body 41 of the shielding plate 4 is stamped to form a pair of stiffening ribs 414 extending along the vertical direction. The stiffening ribs 414 extend towards the windows 413 at opposite ends while space a distance from the windows 413 along the vertical direction. The stiffening ribs 414 can help the main body 41 to enhance its intrinsic intensity when the shielding plate 4 is mounted to the first and the second circuit boards 7, 8.

Figure 2:
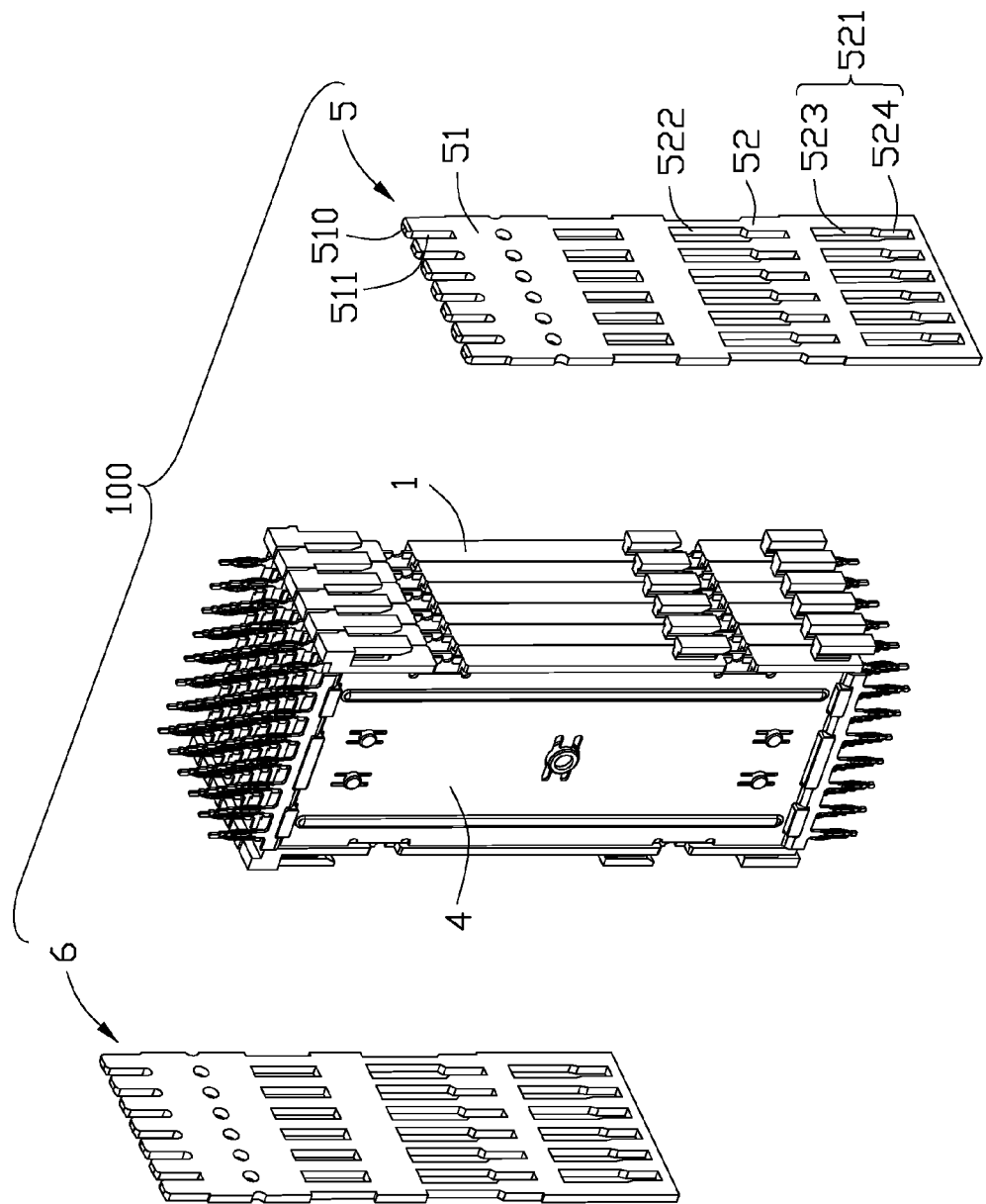
FIG. 2 is a part exploded view of the mezzanine connector with a pair of first and second organizers separated from wafers.
Figure 6:
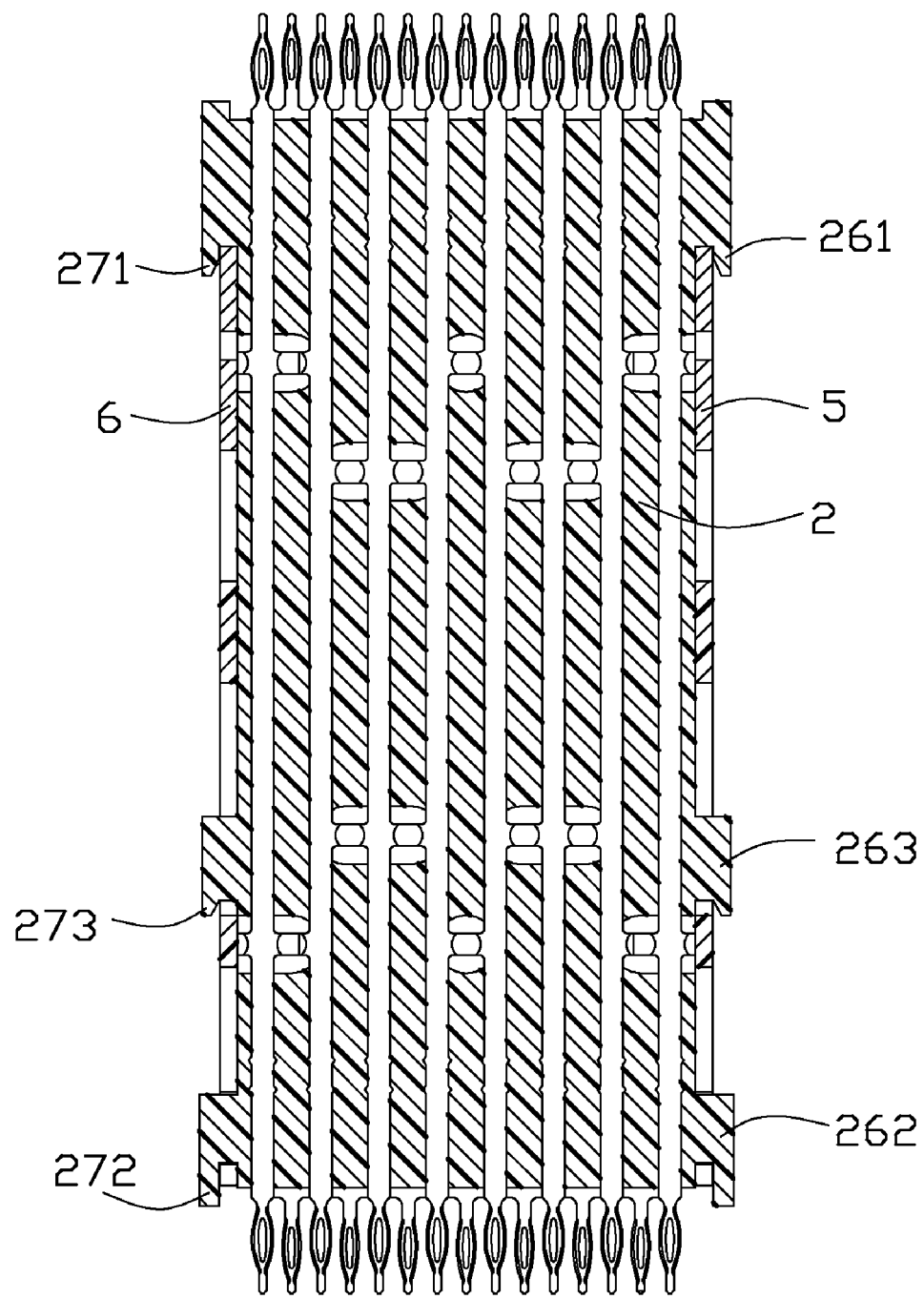
FIG. 6 is a cross-sectional view of the mezzanine connector taken along line 6-6 in FIG. 1.

As shown in FIG. 2, since the organizers 5, 6 are of the same configuration, and only one of them will be detailedly described for simplicity. The organizer 5 is a one piece configuration in accord with a first embodiment of the present invention. The organizer 5 includes a first part 51 with a plurality of first openings 511 extending through a top end 510 of the first part 51, and second part 52 defining a row of second openings 521 and a row of middle openings 522 between the first and the second openings 521 along the vertical direction. Each of the second opening 521 and the middle opening 522 include an upper wider section 523 and a lower narrower section 524 in communication with the upper wider section 523. The upper wider section 523 is wide enough to receive the second tab 262 and the middle tab 263. As shown in FIGS. 5 and 6, in assembly, after the organizer 5 is preliminary assembled to the second and the middle tabs 262, 263, the organizer 5 is then upwardly pushed so that the contractive portions 264 are stably received in the first openings 511 and the narrower sections 524. As a result, the separate wafers 1 are jointly unified.

Figure 7:
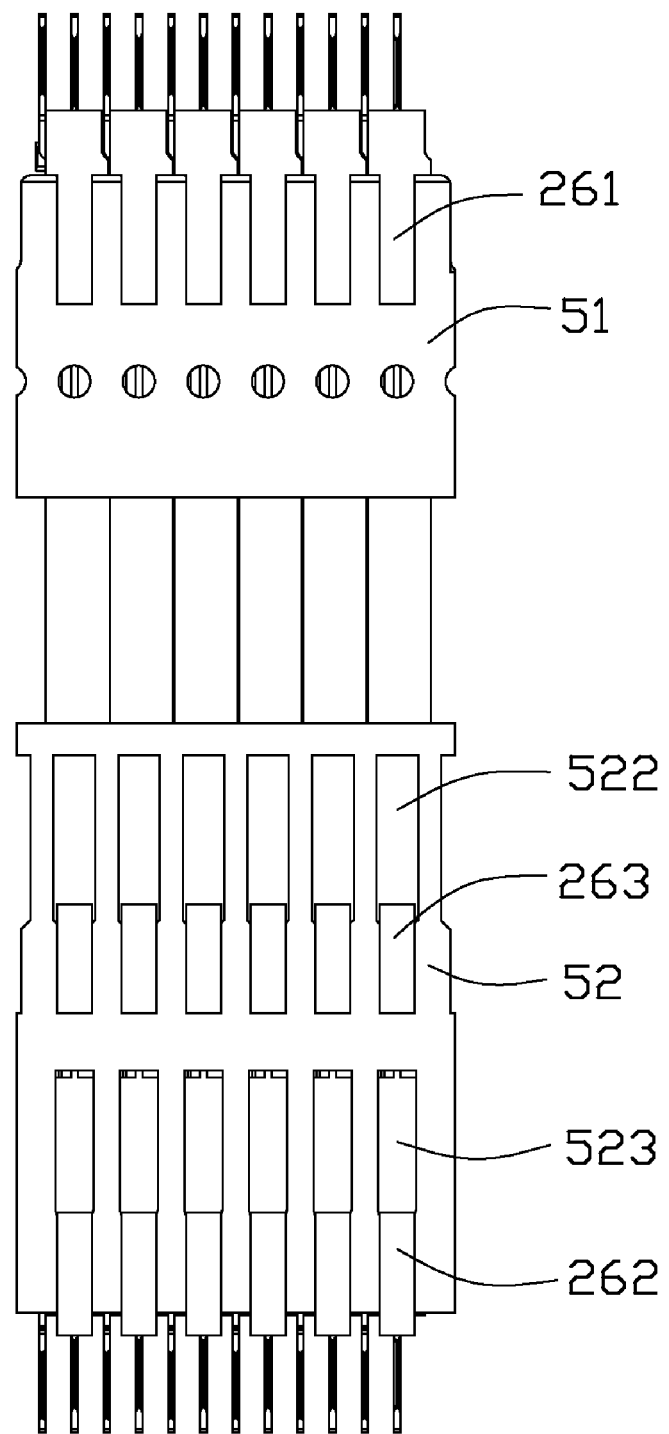
FIG. 7 is a front view of another mezzanine connector similar to that of the FIG. 5, in accordance with an alternative embodiment of the present invention.

As shown in FIG. 7, according to a second embodiment of the invention, the first and the second parts 51 and 52 of the organizers 5, 6 can be separated from each other. In assembly, the first part 51 is attached to the first tabs 261 along a bottom-to-up direction, and the second part 52 is attached to the second tabs 262 along an up-to-bottom direction. As a result, the independent wafers 1 can be unified as well.

It is to be understood, however, that even though numerous, characteristics and advantages of the present invention have been set forth in the foregoing description, together with details of the structure and function of the invention, the disclosed is illustrative only, and changes may be made in detail, especially in matters of number, shape, size, and arrangement of parts within the principles of the invention to the full extent indicated by the broad general meaning of the terms in which the appended claims are expressed.

What is claimed is:

1. A mezzanine connector for connecting a first circuit board and a second circuit board parallel to the first circuit board, comprising:

a plurality of wafers side-by-side arranged with each other, each wafer including an insulative housing, a plurality of contacts fixed in the insulative housing, and a shielding plate assembled to a first side of the insulative housing to shield the contacts of an adjacent wafer, each contact including a retaining portion fixed in the insulative housing, a first tail extending from a first end of the retaining portion for being mounted to the first circuit board, and a second tail extending from a second end of the retaining portion for being mounted to the second circuit board, each insulative housing comprising a first tab extending beyond a lateral side thereof; and an organizer assembled to the first tabs to unify the wafers:
wherein
each insulative housing comprises a third tab extending beyond another lateral side thereof opposite to the first tab, the mezzanine connector further comprising another organizer assembled to the third tabs opposite to the organizer.

2. The mezzanine connector as claimed in claim 1, wherein the first and the second tails of each contact are aligned in a line, the retaining portion of each contact being embedded in the insulative housing.

3. The mezzanine connector as claimed in claim 1, wherein the insulative housing defines a depression recessed from the first side, and the shielding plate comprises a main body received in the depression.

4. The mezzanine connector as claimed in claim 3, wherein the insulative housing comprises a protrusion in the depression, and the main body of the shielding plate comprises a mounting hole receiving the protrusion.

5. The mezzanine connector as claimed in claim 4, wherein the main body comprises a pair of arms extending into the mounting hole to engage with the protrusion.

6. The mezzanine connector as claimed in claim 3, wherein the insulative housing comprises a block and the shielding plate comprises an outward section bent from the main body, the outward section defining a through hole engaging with the block of the insulative housing, the main body of the shielding plate including a stiffening rib adjacent to while spacing a distance from the through hole.

7. The mezzanine connector as claimed in claim 1, wherein each insulative housing comprises a second tab extending beyond the lateral side and spacing a distance from the first tab along a vertical direction, the organizer defining a plurality of first and second holes respectively receiving the first and the second tabs.

8. The mezzanine connector as claimed in claim 7, wherein the first and the second tabs comprise first and second inner contractive portions, respectively, the first hole extending through an end of the organizer to engage with the first contractive portion, the second hole comprising a widened section and a narrowed section communicating with the widened section, the second inner contractive portion sliding from the widened section to be finally received in the narrowed section.

9. A mezzanine connector assembly, comprising:
   a first circuit board;
   a second circuit board parallel to the first circuit board; and
   a mezzanine connector mounted between the first and the second circuit boards, the mezzanine connector comprising:
   a plurality of wafers stacked with each other in a horizontal direction, each wafer including an insulative housing, a plurality of contacts in the insulative housing, and a shielding plate assembled to a first side of the insulative housing to shield the contacts of an adjacent wafer, each contact including a first tail mounted to the first circuit board, and a second tail mounted to the second circuit board, the first and the second tails extending along opposite directions along a vertical direction perpendicular to the horizontal direction; wherein
   each insulative housing comprises a first tab and a second tab extending beyond a same lateral side thereof, the second tab spacing a distance from the first tab along a vertical direction, and an organizer, the organizer defining a plurality of first and second openings respectively receiving the first and the second tabs.

10. The mezzanine connector assembly as claimed in claim 9, wherein the first openings extend through an end of the organizer, and the first openings are discontinuous from the second openings along the vertical direction.

11. The mezzanine connector assembly as claimed in claim 10, wherein the first and the second tabs comprise first and second inner contractive portions, respectively, the first opening engaging with the first contractive portion, the second opening comprising a widened section and a narrowed section communicating with each other, the second inner contractive portion sliding from the widened section to be finally received in the narrowed section.

12. The mezzanine connector assembly as claimed in claim 10, wherein the organizer is of a single piece configuration.

13. The mezzanine connector assembly as claimed in claim 10, wherein the insulative housing of each wafer defines a depression recessed from the first side, and the shielding plate comprises a main body received in the depression.

14. The mezzanine connector assembly as claimed in claim 13, wherein the insulative housing comprises a block and the shielding plate comprises an outward section bent from the main body, the outward section defining a through hole engaging with the block of the insulative housing, the main body of the shielding plate including a stiffening rib adjacent to while spacing a distance from the through hole along the vertical direction.

15. The mezzanine connector assembly as claimed in claim 14, wherein the insulative housing comprises a protrusion in the depression, and the main body of the shielding plate comprises a mounting hole receiving the protrusion and a pair of arms extending into the mounting hole to engage with the protrusion.

16. The mezzanine connector assembly as claimed in claim 9, wherein the first and the second tails of each contact are aligned in a line along the vertical direction.

17. A mezzanine connector comprising:
   a plurality of wafers side by side arranged with one another, each of the wafers including a plurality of contacts insert molded within an insulative housing, said contacts extending along a vertical direction and originally transversely linked with one another via connection sections each located between adjacent two contacts and subsequently removed therefrom after the housing is insert molded with the contacts; wherein
   every adjacent two contacts have two said connection sections linked therebetween and spaced from each other in the vertical direction categorized as an upper connection section and a lower connection section, under condition that the upper connection sections of said contacts are not all transversely aligned with one another but in an alternate offset manner for avoiding force concentration along one transverse line due to removal of said connection section after the housing is insert molded with said contacts.

18. The mezzanine connector as claimed in claim 17, wherein the housing of each wafer includes a plurality of tabs along an edge, and each tab defines a narrowed portion to link to a main body of the housing, and an organizer is attached upon side edges of the housings of the wafers with a plurality of opening in rows to receive the corresponding tabs, respectively, for retaining the wafers together.

19. The mezzanine connector as claimed in claim 18, wherein each of said openings defines a wider section and a narrower section so that the wider section allows the corresponding tab to pass when the organizer approaches the wafer transversely and the narrowed section is locked by the corresponding tab after the organizer successively moves along the corresponding narrowed portion in said vertical direction.

20. The mezzanine connector as claimed in claim 17, wherein each wafer comprises a shielding plate assembled to a side of the housing to shield the contacts of an adjacent wafer.

* * * * *